United States Patent
Hsing Chen et al.

(10) Patent No.: US 9,263,654 B2
(45) Date of Patent: Feb. 16, 2016

(54) LED PACKAGE IMPROVED STRUCTURE AND FABRICATING METHOD THEREOF

(71) Applicant: PROLIGHT OPTO TECHNOLOGY CORPORATION, TaoYuan County (TW)

(72) Inventors: Chen-Lun Hsing Chen, TaoYuan County (TW); Jung-Hao Hung, TaoYuan County (TW); Ding-Yao Lin, TaoYuan County (TW)

(73) Assignee: PROLIGHT OPTO TECHNOLOGY CORPORATION, Taoyuan (TW)

(*) Notice: Subject to any disclaimer, the term of this patent is extended or adjusted under 35 U.S.C. 154(b) by 0 days.

(21) Appl. No.: 14/517,936

(22) Filed: Oct. 20, 2014

(65) Prior Publication Data

US 2015/0357538 A1  Dec. 10, 2015

(30) Foreign Application Priority Data

Jun. 9, 2014 (TW) .............................. 103119893 A (51) Int. Cl.
*H01L 33/00* (2010.01)
*H01L 33/60* (2010.01)

(52) U.S. Cl.
CPC ......... *H01L 33/60* (2013.01); *H01L 2933/0033* (2013.01); *H01L 2933/0058* (2013.01)

(58) Field of Classification Search
CPC ............... H01L 2924/00; H01L 2924/00014; H01L 2224/32225; H01L 2224/48091; H01L 2224/16225; H01L 2924/00012; H01L 2224/73204; H01L 2224/73265; H01L 2224/48227; H01L 2924/07811; H01L 2924/12041
USPC ........................................................... 257/98
See application file for complete search history.

(56) References Cited

U.S. PATENT DOCUMENTS

| | | | | |
|---|---|---|---|---|
| 7,125,160 | B2* | 10/2006 | Wong | F21V 5/048 362/309 |
| 2011/0169033 | A1* | 7/2011 | Fukunaga | C07D 249/12 257/98 |
| 2015/0243859 | A1* | 8/2015 | Schmidtke | H01L 33/58 257/98 |

* cited by examiner

*Primary Examiner* — Tod T Van Roy
*Assistant Examiner* — Vu A Vu
(74) *Attorney, Agent, or Firm* — CKC & Partners Co., Ltd.

(57) ABSTRACT

A LED (Light-Emitting Diode) package structure is provided. The LED package improved structure includes a base, a plurality of metallic nanoparticles and a LED unit. The base has an accommodating space, wherein the accommodating space has a bottom surface and at least one side surface surrounding the bottom surface. The metallic nanoparticles cover the bottom surface and/or the side surface. The LED unit is disposed in the accommodating spare, in which light emitted from the LED unit is reflected or scattered by the metallic nanoparticles, each of the metallic nanoparticles has a diameter smaller than 10 nm and is electrically isolated.

8 Claims, 10 Drawing Sheets

LED PACKAGE IMPROVED STRUCTURE AND FABRICATING METHOD THEREOF

RELATED APPLICATIONS

The application claims priority to Taiwan Application Serial Number 103119893, filed on Jun. 9, 2014, which is herein incorporated by reference.

BACKGROUND

1. Technical Field

The present disclosure relates to a LED (Light-Emitting Diode) package improved structure and a fabricating method thereof, and more particularly relates to a LED package improved structure that utilizes metallic nanoparticles for reflecting/scattering light and forming electrical isolation.

2. Description of Related Art

A LED has attracted high attentions in the lighting industry owing to its excellent features such as compact size, low energy consumption, high lighting efficiency, high response speed, longer operation life and contamination free. Applications of the LED are such broad that it can be seen on compact devices such as PDAs, smart phones or Tablets; or huge-size devices such as displays or pilot lamps.

Figure 1:
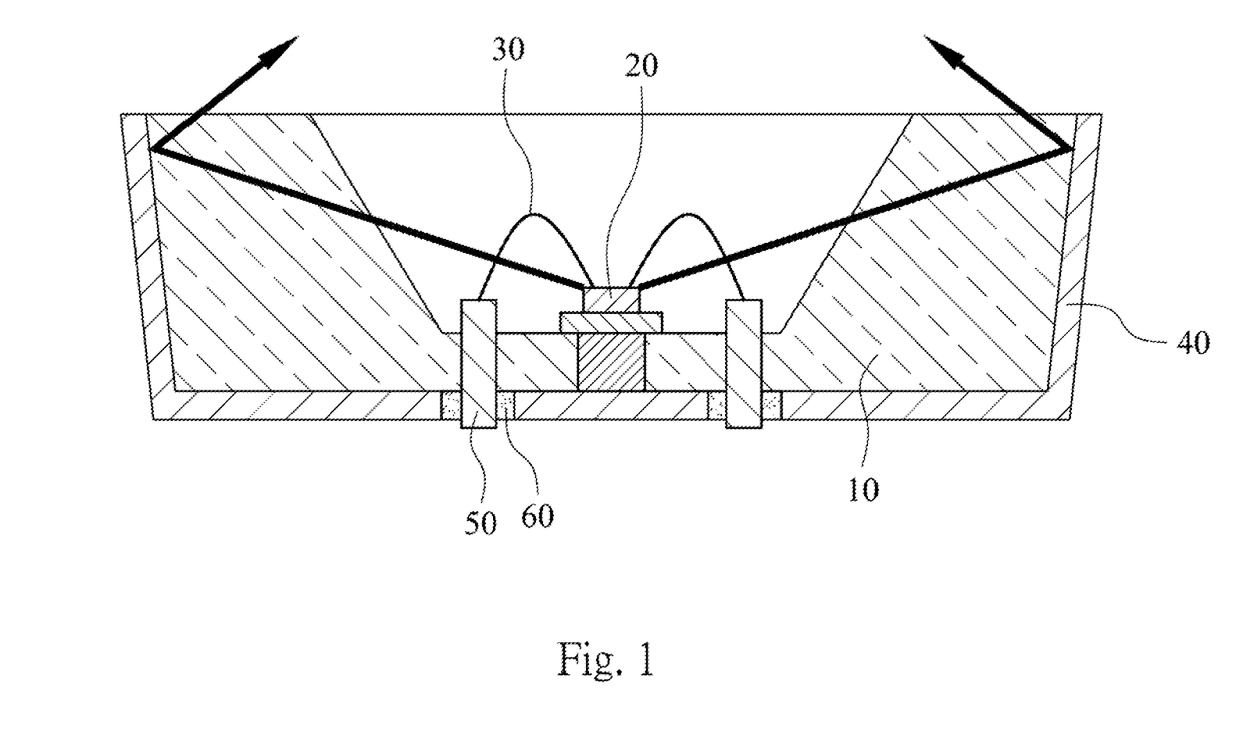
FIG. 1 is a schematic view showing a conventional LED package structure.

A bare LED chip cannot be used and integrated with another device until being packaged. Referring to FIG. 1, FIG. 1 is a schematic view showing a conventional LED package improved structure.

In FIG. 1, a LED chip 20 is generally disposed on a base 10 by a SMD (Surface Mount Device) technology. The base 10 is disposed in a metallic holder 40. A highly reflective surface is formed on the interior of the metallic receiver 40 for reflecting and focusing light emitted from the LED chip 20 so as to enhance light intensity. A conductive wire 30 is connected to the LED chip 20 for providing electric power. The conductive wire 30 is connected to an extended electrode 50. The extended electrode 50 passes through the metallic holder 40 and can be connected to an outer power source.

In the aforementioned package structure, electrical isolation has to be formed between the extensive electrode 50 and the metallic receiver 40 to prevent electric short-circuit, in FIG. 1, the electrical isolation is formed by inserting an insulation material 60 between the extended electrode 50 and the metallic holder 40. Conventionally, there are various methods used for forming the electrical isolation, such as adding an insulation chip, adding an additional electrical circuit or dramatically modifying the package structure.

However, the aforementioned methods for forming the electrical isolation will increase material cost, in which the addition of the additional electrical circuit or the dramatic change on the package structure will result in complicate manufacturing process, thus greatly lowering the manufacturing efficiency.

SUMMARY

According to one aspect of the present disclosure, a LED package improved structure is provided. The LED package improved structure includes a base, a plurality of metallic nanoparticles and a LED unit. The base has an accommodating space, in which the accommodating space has a bottom surface and at least one side surface surrounding the bottom surface. The metallic nanoparticles cover the bottom surface and/or the side surface. The LED unit is disposed in the accommodating space, in which light emitted from the LED unit is reflected or scattered by the metallic nanoparticles, and each of the metallic nanoparticles has a diameter smaller than 10 nm and is electrically isolated.

According to another aspect of the present disclosure, a method for fabricating the LED package improved structure is provided. In the method, a base is provided. An accommodating space is formed in the base, in which the accommodating space is formed by a bottom surface and at least one side surface surrounding the bottom surface and a plurality of metallic nanoparticles cover the bottom surface and/or the side surface. A LED unit is disposed in the accommodating space and then the LED unit is electrically conducted.

BRIEF DESCRIPTION OF THE DRAWINGS

The present disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

The present disclosure provides a LED package improved structure and method for fabricating the LED package improved structure. A plurality of metallic nanoparticles is stacked on a base to form a layer structure for reflecting/scattering light emitted from a LED and achieving electrical isolation. Therefore, the manufacturing process of the LED package improved structure can be simplified and the manufacturing cost can be reduced.

For better understanding the main feature of the present disclosure, concept of the present disclosure is described first. Nano materials such as nanoparticle or nano-film have been attracted high attention recently. When a thin-film is downsized to nano scale, material properties such as optical property, electric property, thermal property, magnetic property, chemical property or mechanical property are dramatically changed. Nano-film can be applied in many fields. In optoelectronic devices, nano-film is mainly applied on the structure itself such as electrode, substrate or light-emission layer. However, in the present disclosure, the metallic nanoparticles or the metallic nano-film (power) is applied not on the structure of the optoelectronic devices (e.g. LED) itself, but in accordance with electrical isolation induced by Fermi-energy leveling phenomena of nano materials, on the package structure of the optoelectronic devices. Therefore, it is not required to utilize extra insulation materials or electric circuit to the structure of the optoelectronic device to prevent electric short circuit. Therefore, manufacturing cost can be reduced. Emitted light can also be enhanced owing to the material properties of the metallic nanoparticles or the metallic nano-film.

Figure 2:
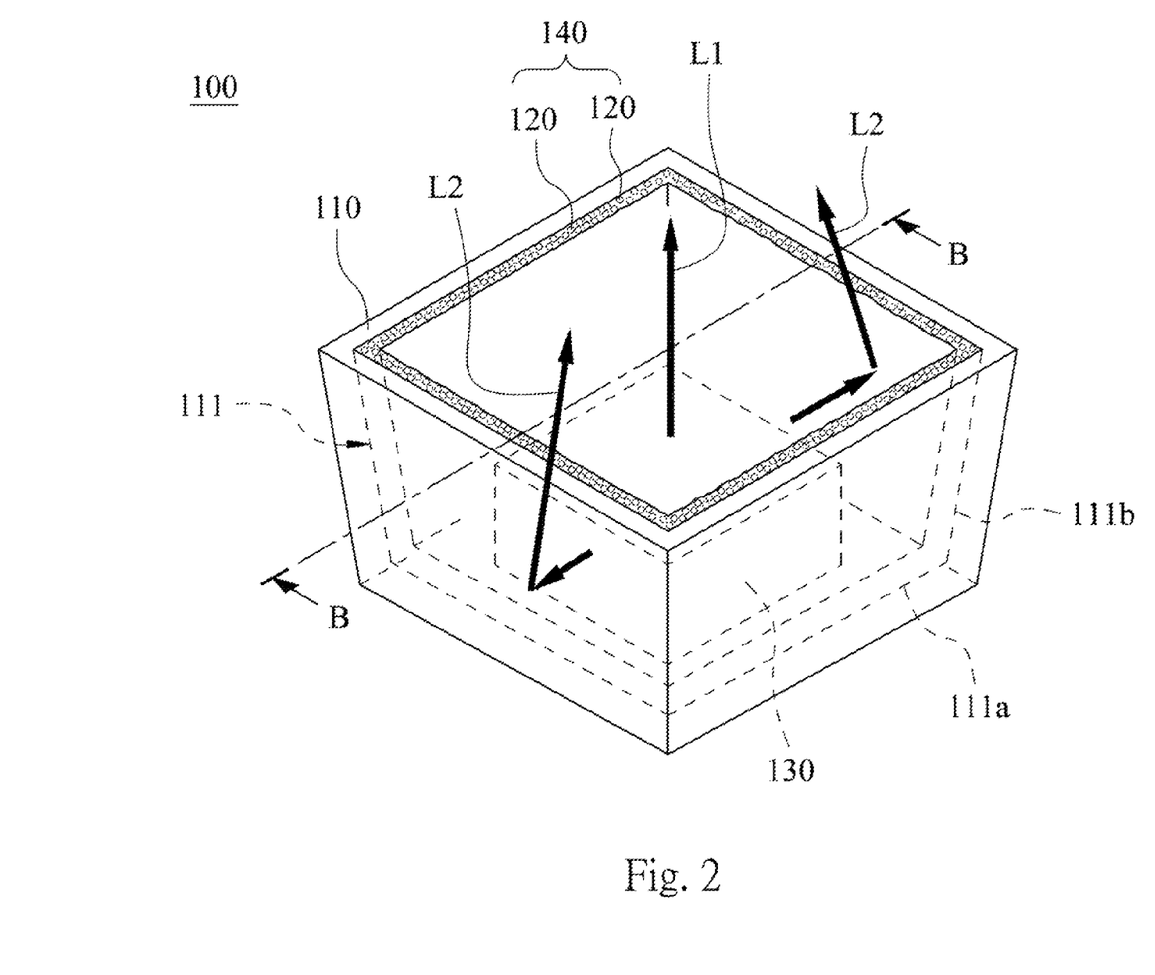
FIG. 2 is a perspective view showing a LED package improved structure according to one embodiment of the present disclosure.
Figure 3A:
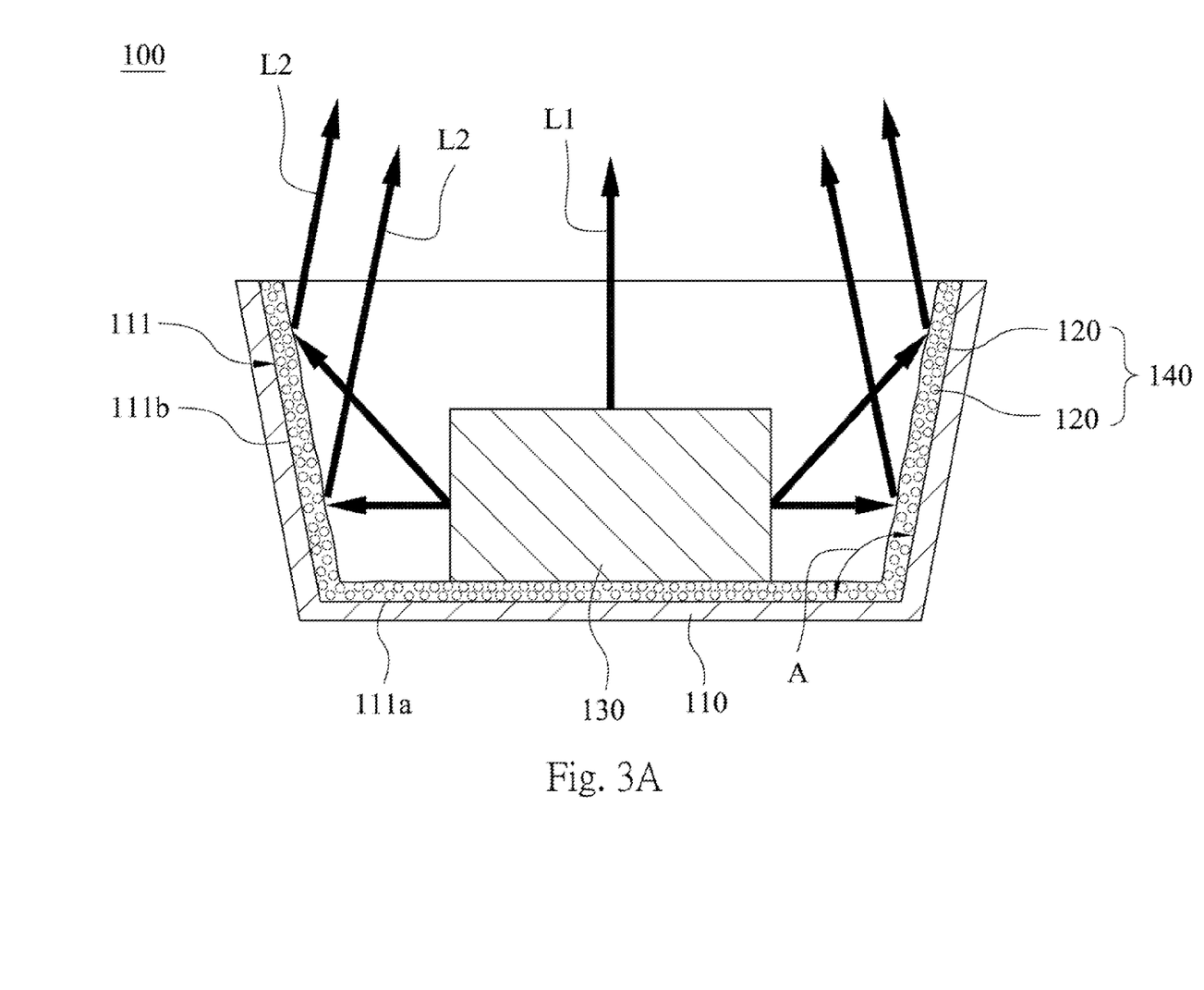
FIG. 3A is a cross-sectional view showing the LED package improved structure of FIG. 2.
Figure 3B:
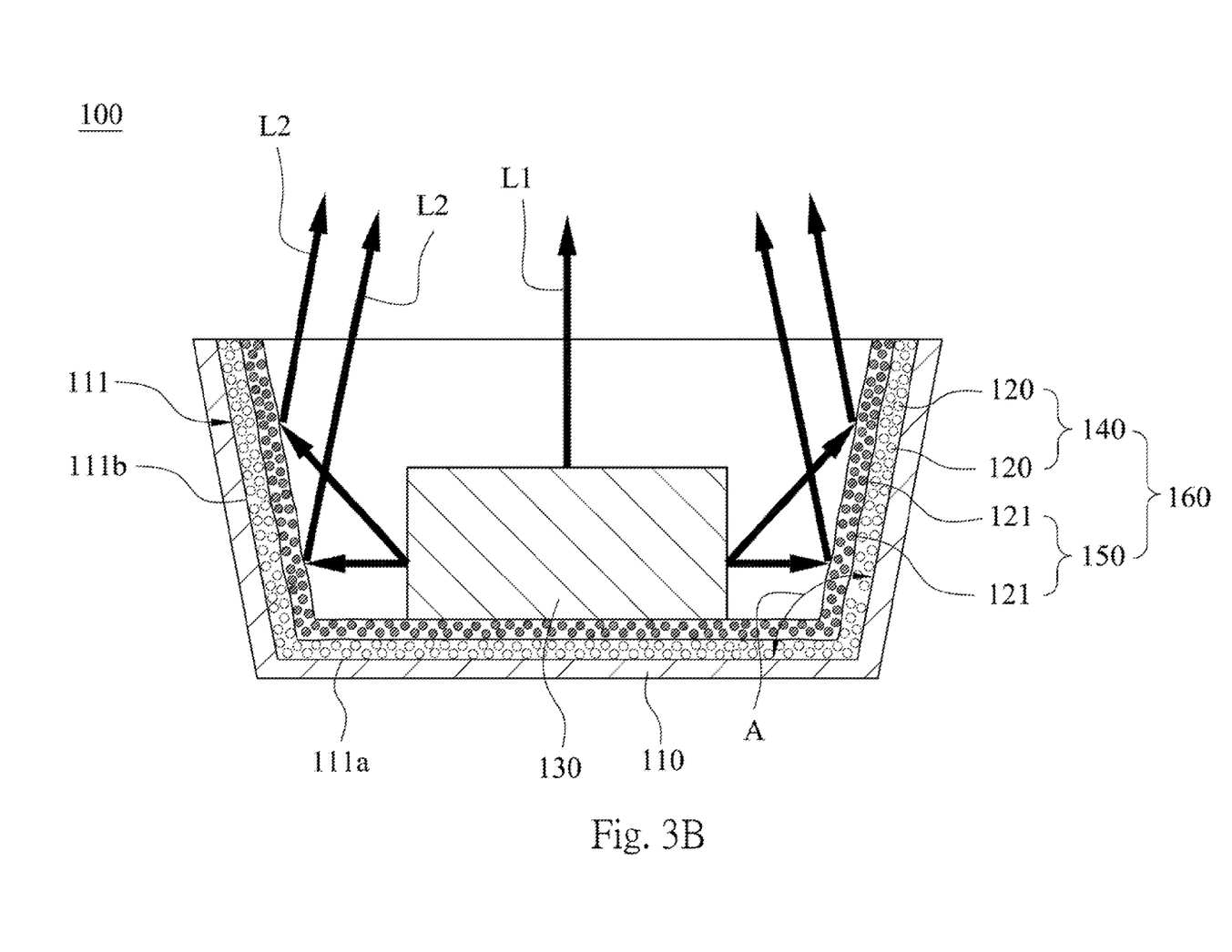
FIG. 3B is a cross-sectional view showing another embodiment of the LED package improved structure of FIG. 3A.
Figure 3C:
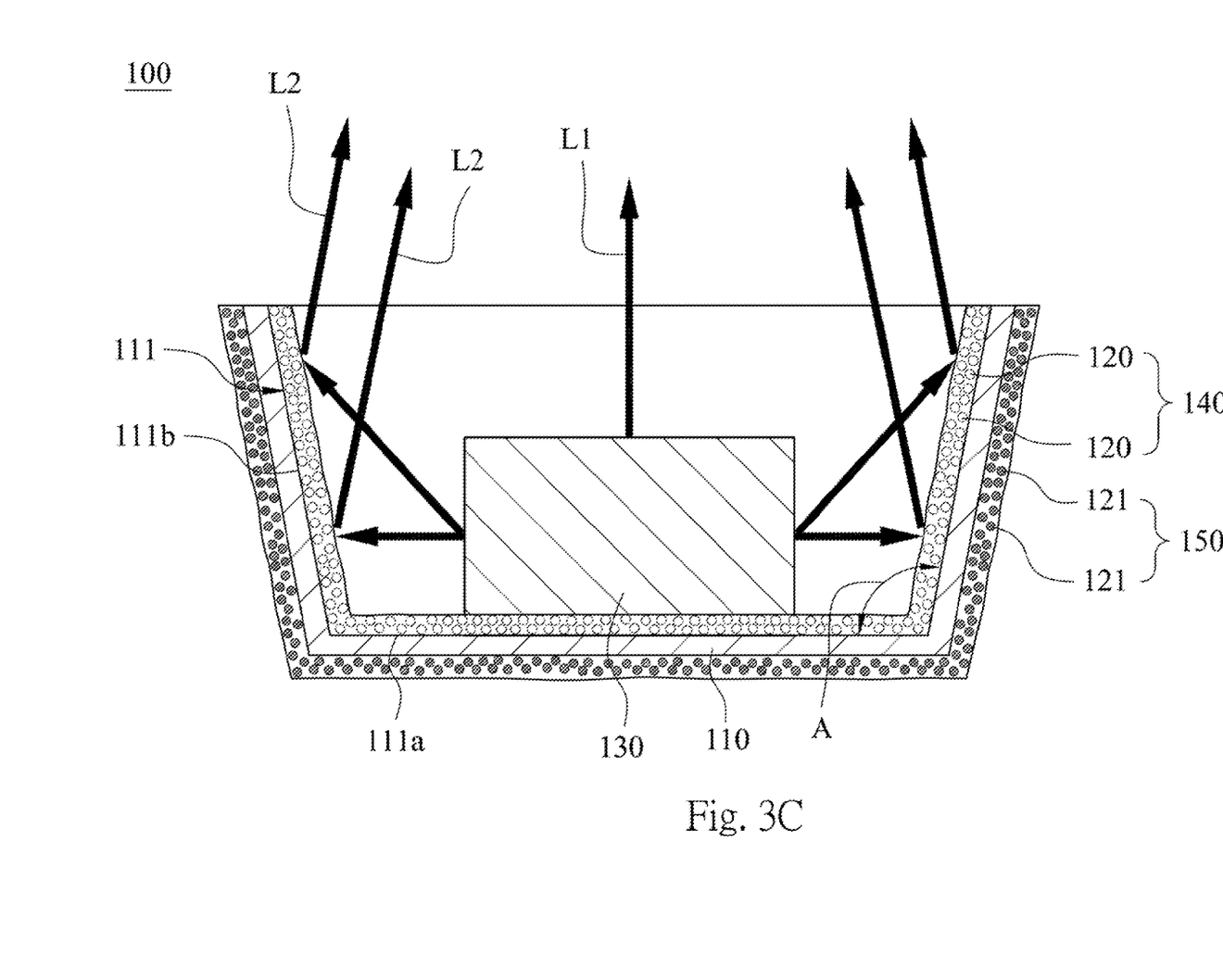
FIG. 3C is a cross-sectional view showing still another embodiment of the LED package improved structure of FIG. 3A.
Figure 3D:
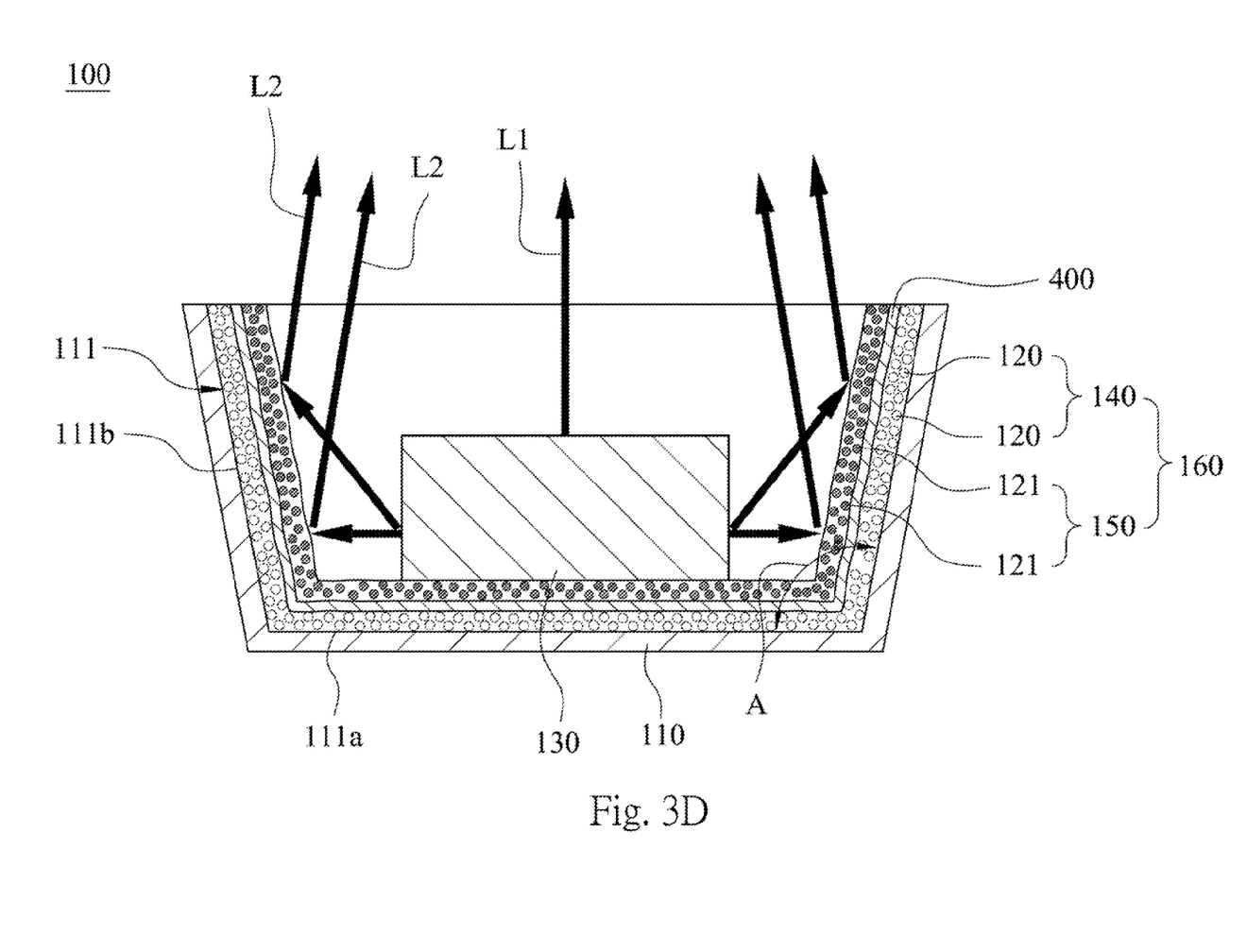
FIG. 3D is a cross-sectional view showing further another embodiment of the LED package improved structure of FIG. 3A.

FIG. 2 is perspective view showing a LED package improved structure 100 according to one embodiment of the present disclosure; FIG. 3A is a cross-sectional view showing the LED package improved structure 100 of FIG. 2; FIG. 3B is a cross-sectional view showing another embodiment of the LED package improved structure 100 of FIG. 3A; and FIG. 3C is a cross-sectional view showing another embodiment of the LED package improved structure 100 of FIG. 3A; FIG. 3D is a cross-sectional view showing further another embodiment of the LED package improved structure of FIG. 3A.

In FIG. 3A, the LED package improved structure 100 includes a base 110, plurality of metallic nanoparticles 120 and a LED unit 130.

The base 110 has an accommodating space 111. The accommodating space 111 has a bottom surface 111a and at least one side surface 111b surrounding the bottom surface 111a. The base 110 can be formed from a metal or non-metal material.

The LED unit 130 is disposed in the accommodating space 111. In one example, the LED unit 130 can be disposed on the bottom surface 111a of the accommodating space 111 by a SMD technology. The number of the LED unit 130 is not limited to one, and more than one LED unit 130 can possibly be utilized in the embodiments of present disclosure.

The metallic nanoparticles 120 are formed to cover the bottom surface 111a and/or the side surface 111b by electroplating, electrophoresis, evaporation, sputtering, chemical vapor deposition, physical vapor deposition, molecular beam epitatxy or atomic layer deposition. A diameter of each of the metallic nanoparticles 120 is smaller than 10 nm, and the metallic nanoparticles 120 can be formed from Al, Pt, Au, Ag, Zn, Cu, Ni, Ti, Zr or Ba.

A layer structure 140 is formed by stacking the metallic nanoparticles 120. The electrical isolation can be formed with a thickness of the layer structure 140 smaller than 10 nm. Front emitted light L1 and side emitted light L2 are emitted from the LED unit 130. Because the metallic nanoparticles 120 owns properties of both metal and nano-material, the side emitted light L2 can be effectively reflected by the metallic nanoparticles 120. Moreover, the layer structure 140 has a dense concave-convex surface, and thus the scattering effect can be enhanced. The emitting angle of the side emitted light L2 reflected by the layer structure 140 is increased, and thus the light focusing effect better than that of the conventional reflective film can be achieved. Furthermore, an angle A formed between the bottom surface 111a and the side surface 111b can be freely adjusted, and thus better light focusing effect can be achieved.

In FIG. 3B, the layer structure 140 is formed by stacking the metallic nanoparticles 120, a layer structure 150 is formed by stacking, metallic nanoparticles 121, and the layer structure 150 and the layer structure 140 are combined to form a multilayer structure 160, and better light reflecting/scattering effect can be achieved for increasing lighting efficiency. The metallic nanoparticles 120 and the metallic nanoparticles 121 can be made from the same or different materials. The materials can be Al, Pt, Au, Ag, Zn, Cu, Ni, Ti, Zr or Ba. When different materials are utilized, better light reflecting/scattering effect can be achieved and lighting efficiency can be enhanced.

In one example, an inorganic layer structure can also be applied in the aforementioned embodiment. The inorganic layer structure can be alternately stacked with the layer structure 140 and/or the layer structure 150 in a selective order. For example, in FIG. 3D, the inorganic layer structure 400 can be stacked between the layer structure 140 and the layer structure 150, or, the inorganic layer structure 400 can be stacked outside the layer structure 140 and the layer structure 150. The inorganic layer structure 400 can be formed from $ZrO_2$, $TiO_2$, $BaSO_4$, $SiO_2$, $AlN$ or $Al_2O_3$.

In FIG. 3C, the metallic nanoparticles 121 can cover the exterior of the base 110 to form a layer structure 150. Because of the properties of the metallic nanoparticles 121, the layer structure 150 has superior heat dissipation effect than the conventional material. Therefore, the operation life of the LED package improved structure 100 can be increased and lighting efficiency can be enhanced.

Figure 4:
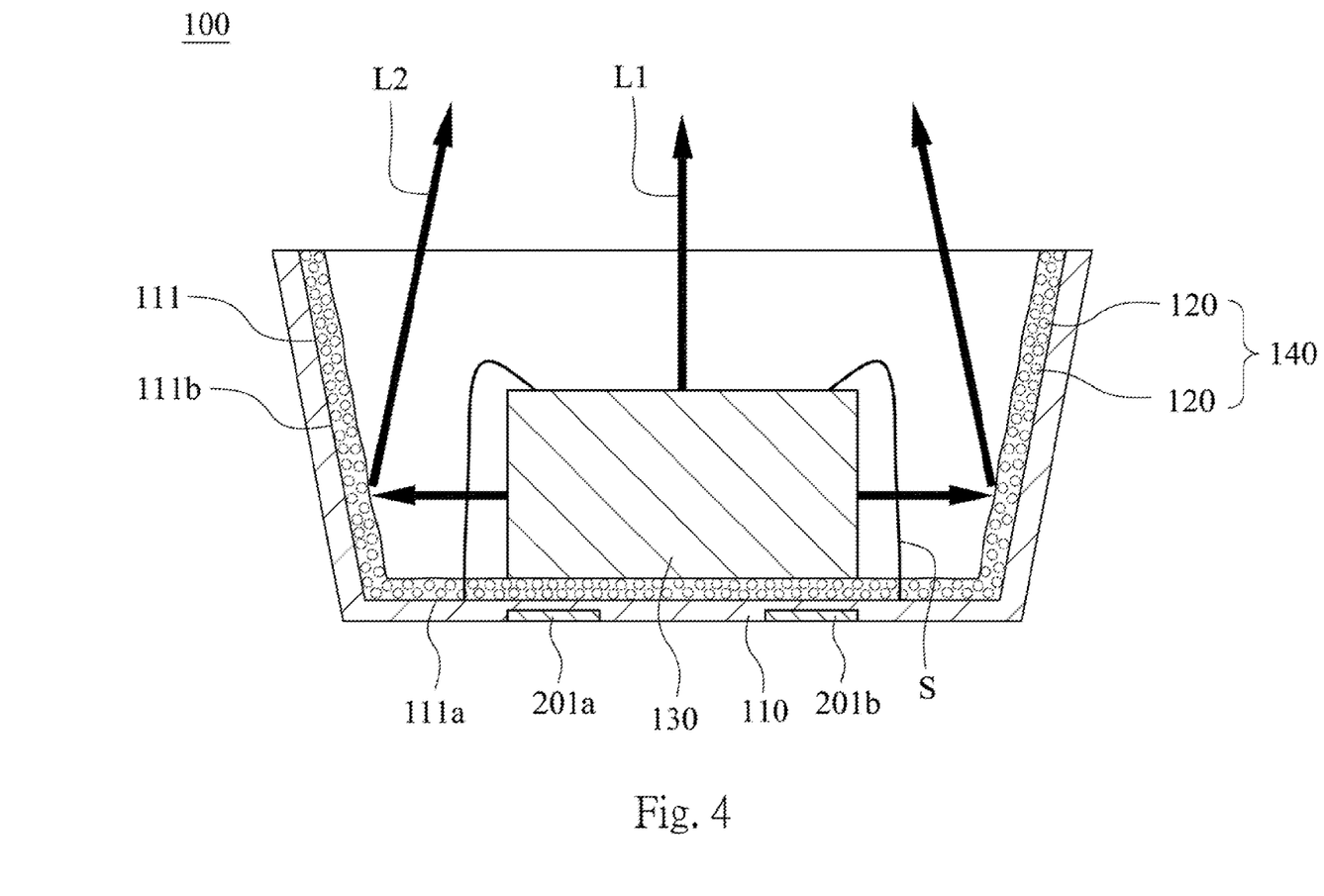
FIG. 4 is a schematic view showing another embodiment of the LED package improved structure of FIG. 2.

FIG. 4 is a schematic view showing another embodiment of the LED package improved structure 100 of FIG. 2. In FIG. 4, the LED unit 130 is a horizontal electrode type LED unit 130. The LED unit 130 can be disposed in the accommodating space 111 of the base 110. In one example, the LED unit 130 is disposed on the bottom surface 111a of the accommodating space 111. An electrical conductive portion 201a and an electrical conductive portion 201b are disposed on the base 110 for electrical conduction. The electrical conductive portion 201a and the electrical conductive portion 201b are electrically connected to the positive electrode and the negative electrode of the LED unit 130 respectively by conductive wires S. The metallic nanoparticles 120 cover the bottom surface 111a and the side surface 111b of the accommodating space 111 to form a layer structure 140. The layer structure 140 can reflect/scatter the front emitted light L1 and the side emitted light L2. Because a thickness of the layer structure 140 is controlled to be smaller than 10 nm, electrical isolation is formed with the light reflecting/scattering effect superior to that of the conventional thin-film having a larger thickness. Since the layer structure 140 is electrically isolated, no extra electric circuit or dramatic modification on the package structure are required, and thus the manufacturing process is simplified and the manufacturing cost can be reduced.

Figure 5:
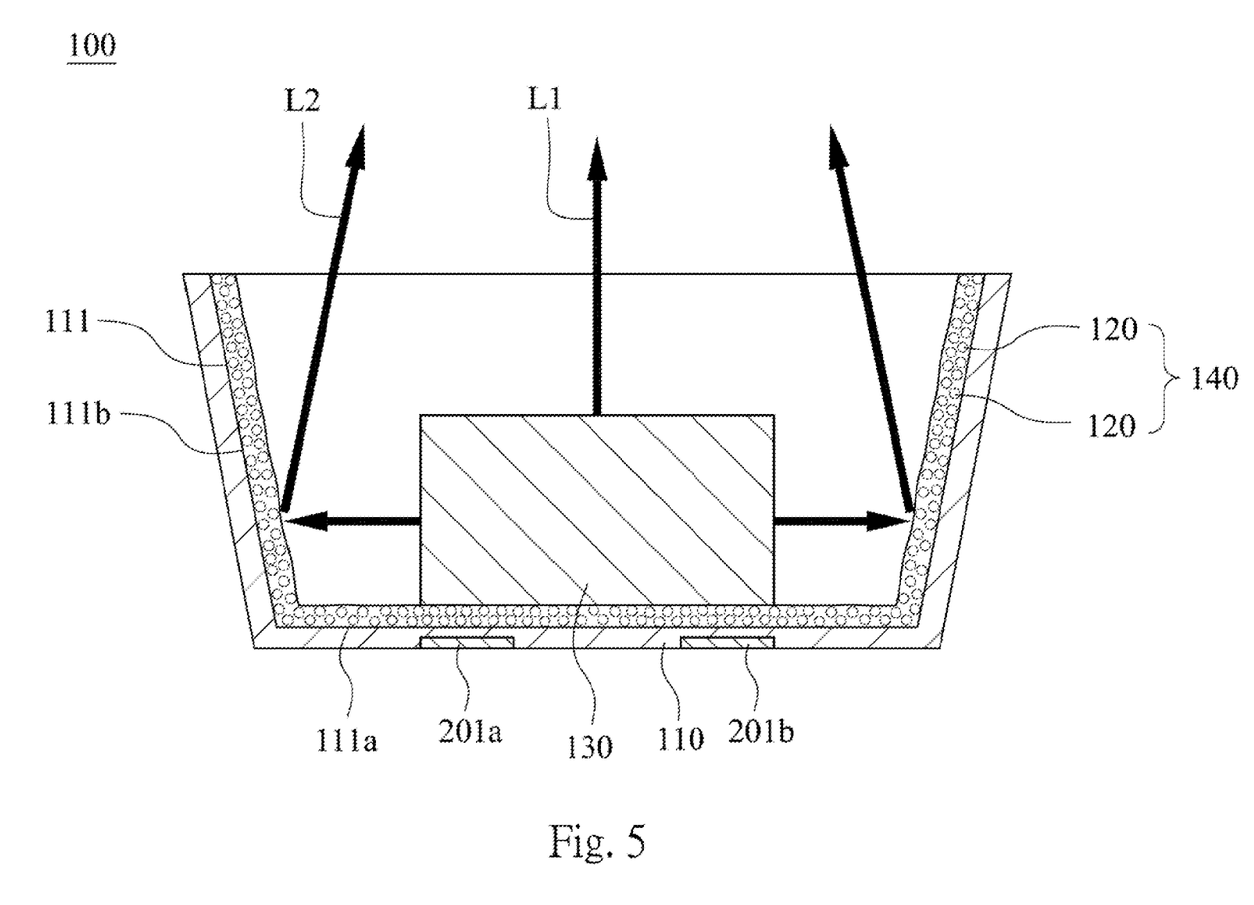
FIG. 5 is a schematic view showing another embodiment of the LED package improved structure of FIG. 2.

FIG. 5 is a schematic view showing another embodiment of the LED package improved structure 100 of FIG. 2. In FIG. 5, the LED unit 130 is a flip-chip type LED unit 130. The native electrodes of the LED unit 130 can act as the electrical conductive portion 201a and the electrical conductive portion 201b. In FIG. 5, the metallic nanoparticles 120 are arranged as those in FIG. 4 and produce the same functions, and thus are not described again herein.

Figure 6:
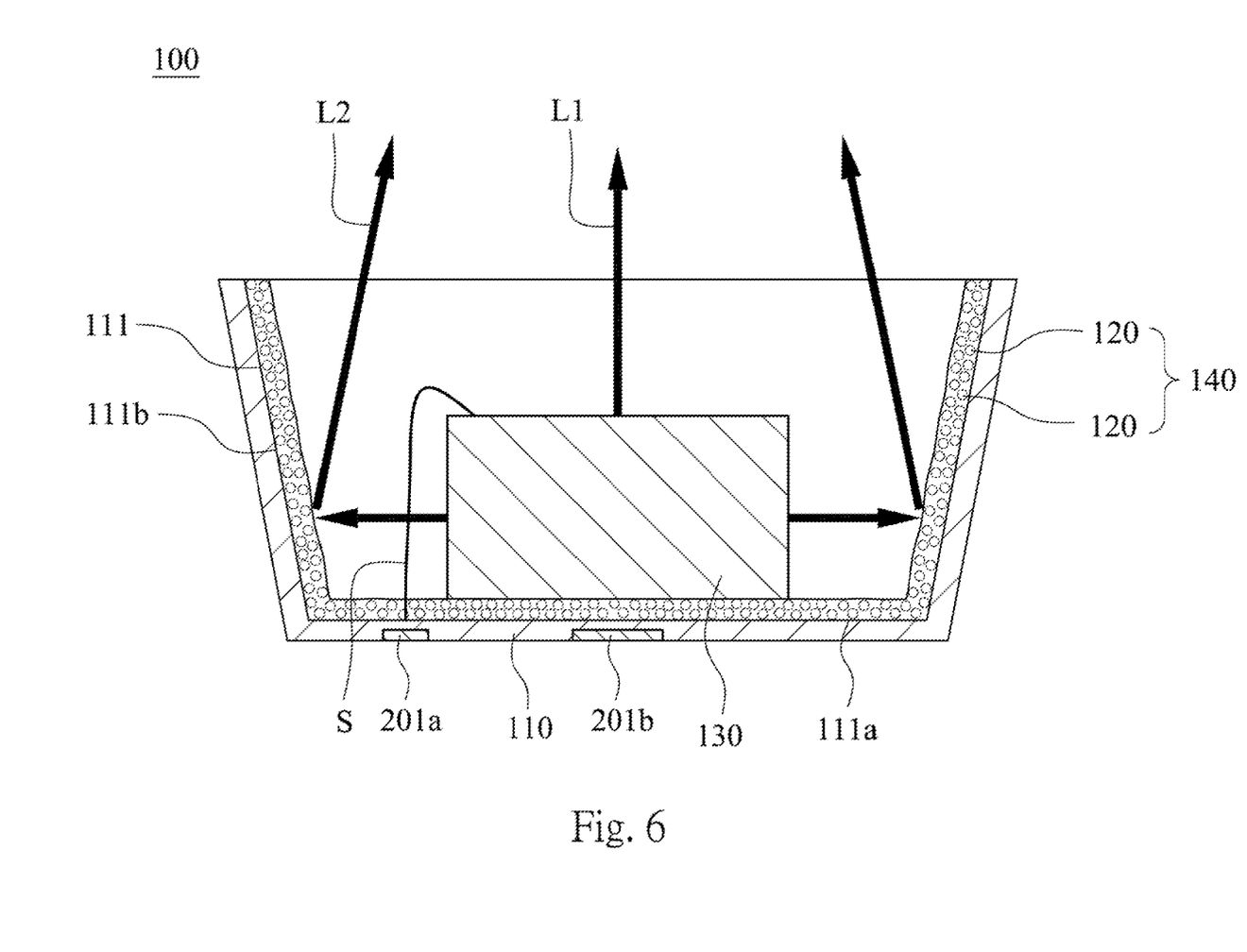
FIG. 6 is a schematic view showing another embodiment of the LED package improved structure of FIG. 2.

FIG. 6 is a schematic vim showing another embodiment of the LED package improved structure 100 of FIG. 2. In FIG. 6, the LED unit 130 is a vertical electrode type LED unit 130. The positive electrode and the negative electrode of the LED unit 130 are located on the top side and the bottom side of the LED unit 130 respectively (not shown). One electrode can be electrically connected to the electrical conductive portion 201a, and the other electrode can be electrically connected to the electrical conductive portion 201b through the base 110 to form an electrical connection. In FIG. 6, the metallic nanoparticles 120 are arranged as those in FIG. 4 and produce the same functions, and thus are not described again herein.

Figure 7:
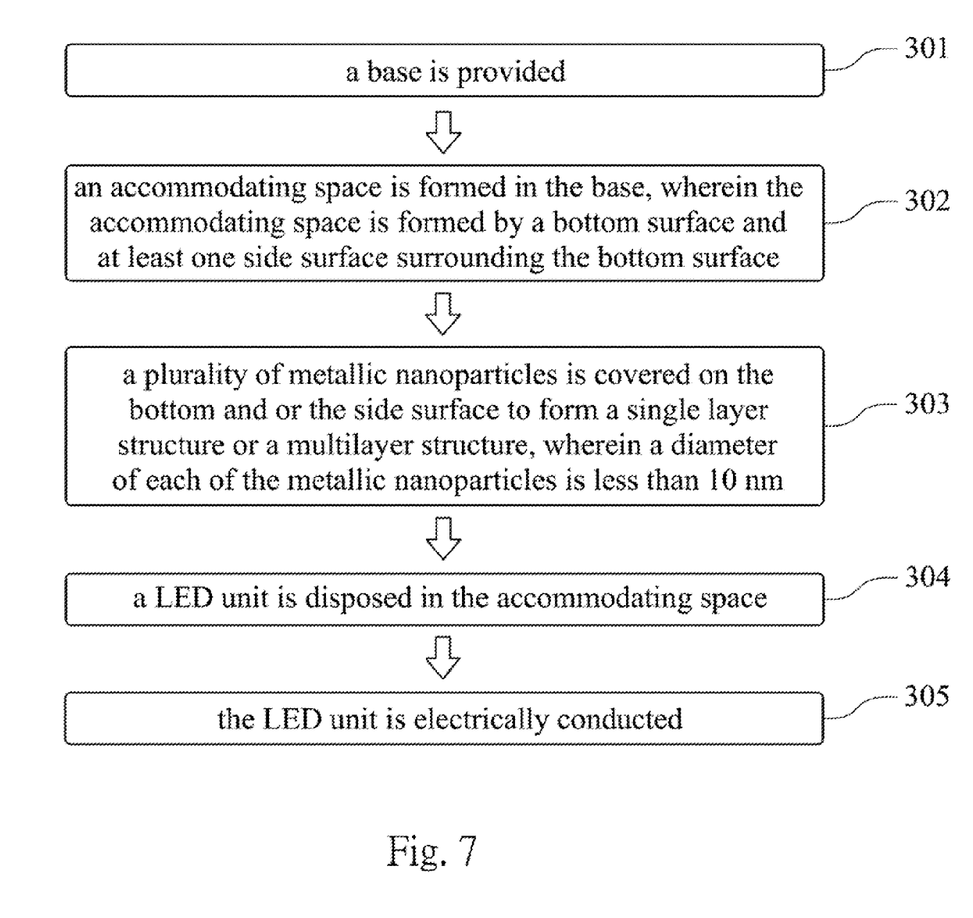
FIG. 7 is a flow chart showing a method for fabricating a LED package improved structure according to one embodiment of the present disclosure.

FIG. 7 is a flow chart showing a method for fabricating a LED package improved structure according to one embodiment of the present disclosure. The method includes the following steps:

At step 301, a base is provided.

At step 302, an accommodating space is formed in the base, in which the accommodating space is formed by a bottom surface and at least one side surface surrounding the bottom surface.

At step 303, a plurality of metallic nanoparticles covers the bottom and/or the side surface to form a single layer structure or to multilayer structure, in which to diameter of each of the metallic nanoparticles is less than 10 nm.

At step 304, a LED unit, is disposed in the accommodating space.

At step 305, the LED unit is electrically conducted.

At the aforementioned step 303, a thickness of the single layer structure is controlled to be smaller than 10 nm, or a total thickness of the multilayer structure is controlled to be smaller than 10 nm.

At the aforementioned step 305, the LED unit can be electrically conducted in any conventional method. However, the layer structure 140 of the present disclosure is formed by stacking the metallic nanoparticles 120 and has excellent light reflecting/scatter effect and high electrical isolation. Therefore, it is simpler to electrically conduct the LED unit 130 to an outer power source than the conventional skill.

In sum, the present disclosure provides a LED package improved structure. The LED package improved structure includes a base, a plurality of metallic nanoparticles and a LED unit. The base has an accommodating space. The metallic nanoparticles cover the bottom and for the side surface of the accommodating space. The LED unit is disposed in the accommodating space. When a diameter of each of the metallic nanoparticles or a thickness of a layer structure formed by stacking the metallic nanoparticles is smaller than 10 nm, electrical isolation is formed. Therefore, the metallic nanoparticles have properties of both metal and nano-material Light emitted from the LED unit can be effectively reflected or scattered for obtaining better light focusing effect. Because the metallic nanoparticles are electrical isolated, electric short circuit issue occurring on the conventional LED package improved structure can be prevented. Therefore, no additional insulation material or dramatic modification on the package structure is needed. Thus the manufacturing process is simplified and the manufacturing cost is reduced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit, of the disclosure. In view of the foregoing, it is intended that the present disclosure cover modifications and variations of this disclosure provided they fall within the scope of the following claims.

What is claimed is:

1. A LED (Light-Emitting Diode) package improved structure, comprising:
    a base having an accommodating space, wherein the accommodating space has a bottom surface and at least one side surface surrounding the bottom surface;
    a plurality of metallic nanoparticles covering the bottom surface and/or the side surface, wherein the metallic nanonarticles are stacked to form a layer structure and a thickness of the layer structure is smaller than 10 nm;
    an inorganic layer structure alternately stacked with the layer structure formed by stacking the metallic nanonarticles, wherein the inorganic layer structure is formed from $ZrO_2$, $TiO_2$, $BaSO_2$, $SiO_2$, AlN or $Al_2O_3$;
    at least one LED unit disposed in the accommodating space,
    wherein light emitted from the LED unit is reflected/scattered by the layer structure formed by stacking the metallic nanoparticles, each of the metallic nanoparticles has a diameter smaller than 10 nm and is electrically isolated.

2. The LED package improved structure of claim 1, wherein the metallic nanoparticles are formed from Al, Pt, Au, Ag, Zn, Cu, Ni, Ti, Zr or Ba.

3. The LED package improved structure of claim 1, wherein the layer structure comprises a dense concave-convex surface.

4. The LED package improved structure of claim 1, wherein the metallic nanoparticles cover the exterior of the base.

5. The LED package improved structure of claim 1, wherein the metallic nanoparticles are stacked to form a multilayer structure, wherein a total thickness of the multilayer structure is smaller than 10 nm and materials forming the metallic nanoparticles in the multilayer structure are the same or different, and the materials comprises Al, Pt, Au, Ag, Zn, Cu, Ni, Ti, Zr and/or Ba.

6. The LED package improved structure of claim 1, wherein the LED unit is a horizontal electrode type LED unit, a vertical electrode type LED unit or a flip-chip type LED unit.

7. A method for fabricating a LED package improved structure, the method comprising:
    providing a base;
    forming an accommodating space in the base, wherein the accommodating space is formed by a bottom surface and at least one side surface surrounding the bottom surface;
    forming a plurality of metallic nanoparticles to cover the bottom surface and/or the side surface;
    stacking the metallic nanoparticles to form a layer structure and a thickness of the layer structure is smaller than 10 nm;
    alternately stacking an inorganic layer structure with the layer structure formed by stacking the metallic nanoparticles, wherein the inorganic layer structure is formed from $ZrO_2$, $TiO_2$, $BaSO_2$, $SiO_2$, AlN or $Al_2O_3$;
    disposing a LED unit in the accommodating space; and
    electrically conducting the LED unit.

8. The method of claim 7, wherein the plurality of metallic nanoparticles are formed by electroplating, electrophoresis, evaporation, sputtering, chemical vapor deposition, physical vapor deposition, molecular beam epitaxy or atomic layer deposition.

* * * * *